(12) United States Patent
Beon et al.

(10) Patent No.: US 11,226,445 B2
(45) Date of Patent: Jan. 18, 2022

(54) DISPLAY DEVICE VIEWABLE WITH POLARIZING SUNGLASSES AND METHOD FOR MANUFACTURING THE SAME

(71) Applicant: Samsung Display Co., Ltd., Yongin-si (KR)

(72) Inventors: Beong-hun Beon, Hwaseong-si (KR); Dukjin Lee, Suwon-si (KR); Woosuk Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/992,006

(22) Filed: Aug. 12, 2020

(65) Prior Publication Data

US 2021/0132275 A1    May 6, 2021

(30) Foreign Application Priority Data

Nov. 1, 2019  (KR) .................. 10-2019-0138869

(51) Int. Cl.
  *G02B 5/30*   (2006.01)
  *G02F 1/1335*   (2006.01)
  *H01L 51/52*   (2006.01)

(52) U.S. Cl.
  CPC ..... *G02B 5/3016* (2013.01); *G02F 1/133528* (2013.01); *G02F 1/133531* (2021.01); *H01L 51/5281* (2013.01)

(58) Field of Classification Search
  CPC ........... G02F 1/133634; G02F 2413/08; G02F 1/0311; G02F 1/1335; G02F 1/133528; G02F 1/133531
  See application file for complete search history.

(56) References Cited

U.S. PATENT DOCUMENTS

| | | | |
|---|---|---|---|
| 6,400,433 B1 * | 6/2002 | Arakawa | G02B 5/3016 349/117 |
| 6,619,799 B1 | 9/2003 | Blum et al. | |
| 8,029,134 B2 | 10/2011 | Blum et al. | |
| 8,203,677 B2 | 6/2012 | Sakai | |
| 8,441,605 B2 | 5/2013 | Sakai | |
| 9,158,143 B2 | 10/2015 | Chen et al. | |
| 9,703,145 B2 | 7/2017 | Ryu et al. | |
| 9,891,360 B2 | 2/2018 | Chang et al. | |
| 10,283,735 B2 | 5/2019 | Kim et al. | |
| 2004/0013337 A1 * | 1/2004 | Purchase | G02B 1/046 385/14 |
| 2016/0266296 A1 * | 9/2016 | Son | H01L 51/0076 |

(Continued)

FOREIGN PATENT DOCUMENTS

| | | |
|---|---|---|
| JP | 2003-504665 | 2/2003 |
| JP | 4609529 | 1/2011 |
| JP | 2011-209749 | 10/2011 |

(Continued)

*Primary Examiner* — Lauren Nguyen

(74) *Attorney, Agent, or Firm* — H.C. Park & Associates, PLC

(57) ABSTRACT

A display device includes a display module that is folded with respect to a folding axis extending in a first direction, a polarization layer disposed on the display module and having a polarization axis parallel to the first direction, and a phase delay layer disposed on the polarization layer and configured to change linearly polarized light, which passes through the polarization layer, into circularly polarized light.

14 Claims, 18 Drawing Sheets

(56) References Cited

U.S. PATENT DOCUMENTS

2017/0125743 A1* 5/2017 Kim .................... H01L 27/3244
2017/0277291 A1* 9/2017 Lee ......................... G06F 3/041

FOREIGN PATENT DOCUMENTS

| | | |
|---|---|---|
| JP | 5639840 | 12/2014 |
| JP | 5639841 | 12/2014 |
| JP | 2015-068847 | 4/2015 |
| JP | 6089348 | 3/2017 |
| JP | 6138267 | 5/2017 |
| JP | 6160237 | 7/2017 |
| JP | 6167479 | 7/2017 |
| JP | WO2016-152459 | 1/2018 |
| JP | 6521007 | 5/2019 |
| KR | 10-2011-0122345 | 11/2011 |
| KR | 10-1557202 | 10/2015 |
| KR | 10-1557598 | 10/2015 |
| KR | 10-1643212 | 7/2016 |
| KR | 10-1700772 | 1/2017 |
| KR | 10-1735149 | 5/2017 |
| KR | 10-2017-0129773 | 11/2017 |
| KR | 10-2018-0057586 | 5/2018 |

\* cited by examiner

FIG. 2
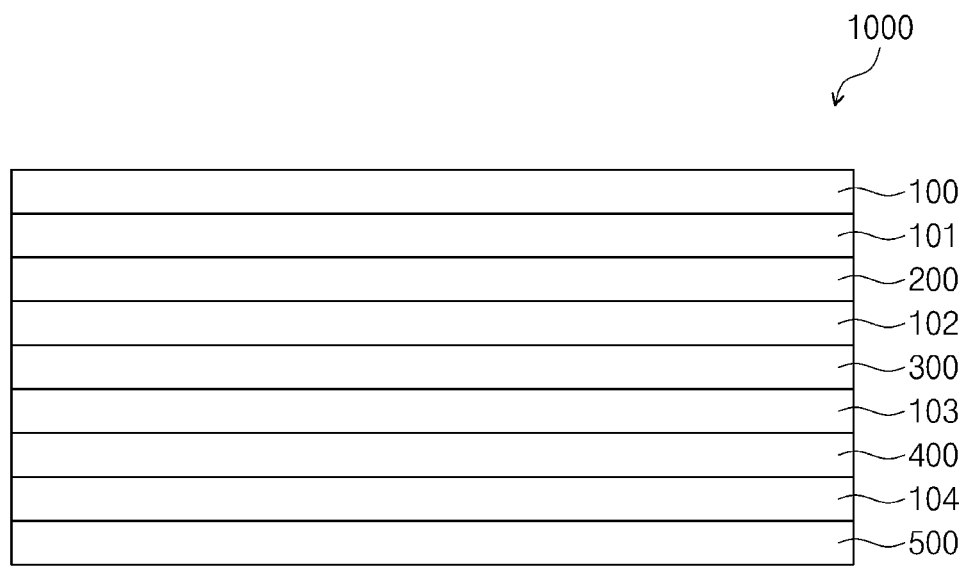
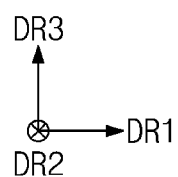

FIG. 6
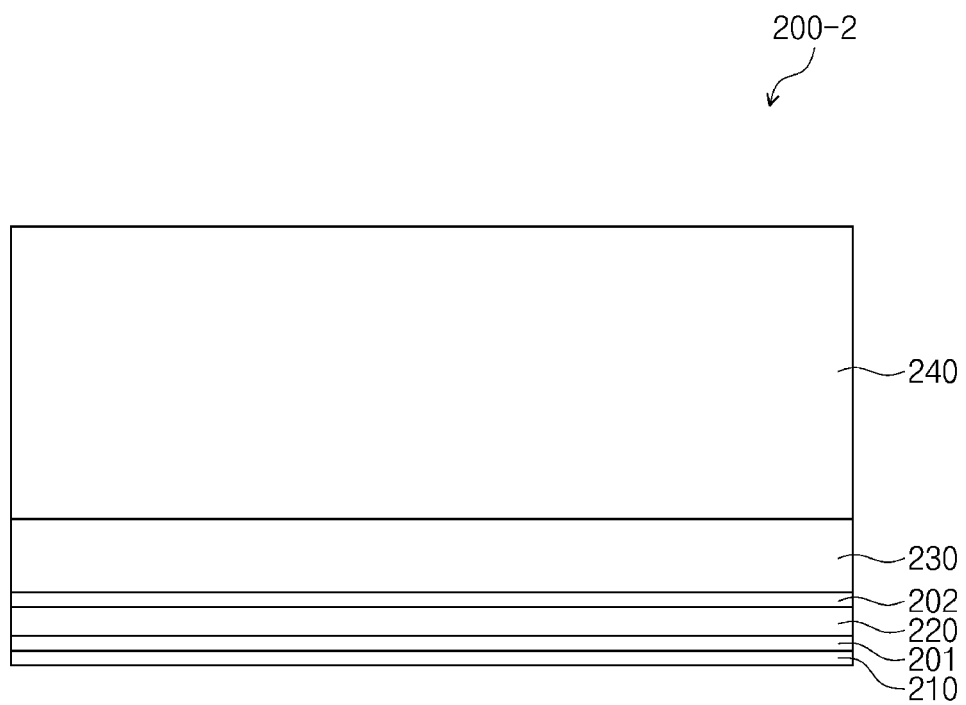
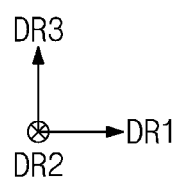

DISPLAY DEVICE VIEWABLE WITH POLARIZING SUNGLASSES AND METHOD FOR MANUFACTURING THE SAME

CROSS-REFERENCE TO RELATED APPLICATIONS

This application claims priority from and the benefit of Korean Patent Application No. 10-2019-0138869, filed on Nov. 1, 2019, which is hereby incorporated by reference for all purposes as if fully set forth herein.

BACKGROUND

Field

Exemplary embodiments/implementations of the invention relate generally to a display device, and more specifically to a display device which includes a polarization layer and is folded, and a method for manufacturing the display device.

Discussion of the Background

A display device displays various images on a display screen and provides a user with the images. Generally, the display device displays information on an assigned screen. Recently, a flexible display device including a foldable flexible display panel has been developed. The flexible display device may be bent, rolled, or curved unlike a rigid display device. The flexible display device having a diversely changeable shape is portable irrespective of the existing size of a screen, and thus the user convenience may be improved.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device having improved product reliability and visibility and methods according to exemplary implementations provide for manufacturing the display device having improved product reliability and visibility.

Additional features of the inventive concepts will be set forth in the description which follows, and in part will be apparent from the description, or may be learned by practice of the inventive concepts.

An embodiment of the inventive concepts provides a display device including: a display module which is folded with respect to a folding axis extending in a first direction; a polarization layer disposed on the display module and having a polarization axis parallel to the first direction; and a phase delay layer disposed on the polarization layer and configured to change linearly polarized light, which passes through the polarization layer, into circularly polarized light.

In an embodiment, the phase delay layer may be a liquid crystal layer.

In an embodiment, the phase delay layer may include rod-shaped liquid crystal molecules or discotic liquid crystal molecules.

In an embodiment, the display device may further include an alignment layer disposed between the polarization layer and the phase delay layer, wherein the alignment layer is in contact with the phase delay layer.

In an embodiment, the display device may further include a protective layer disposed between the alignment layer and the polarization layer, wherein the alignment layer is in contact with the protective layer.

In an embodiment, the phase delay layer may be a stretched film layer.

In an embodiment, a slow axis of the phase delay layer may intersect with the polarization axis.

In an embodiment, an angle between the slow axis and the polarization axis is about 45°±30°.

In an embodiment, a thickness of the phase delay layer is about 1 µm.

In an embodiment, the display device may further includes: a $\lambda/2$ phase delay layer disposed between the display module and the polarization layer; and a $\lambda/4$ phase delay layer disposed between the $\lambda/2$ phase delay layer and the display module, wherein a thickness of the $\lambda/2$ phase delay layer is greater than a thickness of the $\lambda/4$ phase delay layer.

In an embodiment of the inventive concepts, a method for manufacturing a display device includes providing a polarization layer having a polarization axis; providing a protective layer on one surface of the polarization layer; and providing a phase delay layer on one surface of the protective layer, wherein an angle between a slow axis of the phase delay layer and the polarization axis is about 45°±30°.

In an embodiment, the providing of the phase delay layer may include: providing a film; forming an alignment layer on the film; forming a liquid crystal layer on the alignment layer; irradiating the liquid crystal layer with ultraviolet light; attaching the liquid crystal layer to the protective layer; and removing the alignment layer and the film from the liquid crystal layer.

In an embodiment, the providing of the protective layer may include providing an adhesive layer on the one surface of the protective layer, and the liquid crystal layer is attached to the adhesive layer.

In an embodiment, the method may further include forming an alignment layer on the protective layer, wherein the phase delay layer is formed on the alignment layer.

In an embodiment, a thickness of the phase delay layer may be about 1 µm, and the phase delay layer is a $\lambda/4$ phase delay layer.

In an embodiment of the inventive concepts, a display device includes: a display module which is folded with respect to a folding axis extending in a first direction; a first phase delay layer disposed on the display module; a second phase delay layer disposed on the first phase delay layer; a polarization layer disposed on the second phase delay layer and having a polarization axis parallel to the first direction; and a third phase delay layer disposed on the polarization layer and having a slow axis, wherein an angle between the slow axis and the polarization axis is about 45°±30°.

In an embodiment, each of the first phase delay layer and the third phase delay layer may be a $\lambda/4$ phase delay layer, and the second phase delay layer may be a $\lambda/2$ phase delay layer, wherein a thickness of the second phase delay layer is greater than a thickness of the third phase delay layer.

In an embodiment, the display device may further include an alignment layer disposed between the polarization layer and the third phase delay layer, wherein the alignment layer is in contact with the third phase delay layer.

In an embodiment, the display device may further include a protective layer disposed between the alignment layer and the polarization layer, wherein the alignment layer is in contact with the protective layer.

In an embodiment, a total thickness of the first phase delay layer, the second phase delay layer, the polarization layer, the third phase delay layer, the alignment layer, and the protective layer may be about 30 µm to about 35 µm.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the inventive concepts, and are incorporated in and constitute a part of this specification. The drawings illustrate exemplary embodiments of the inventive concepts and, together with the description, serve to explain principles of the inventive concepts.

FIG. 2 is a cross-sectional view of a display device according to an embodiment of the inventive concepts.

FIG. 6 is a cross-sectional view of an upper functional layer according to an embodiment of the inventive concepts.

DETAILED DESCRIPTION

Figure 1A:
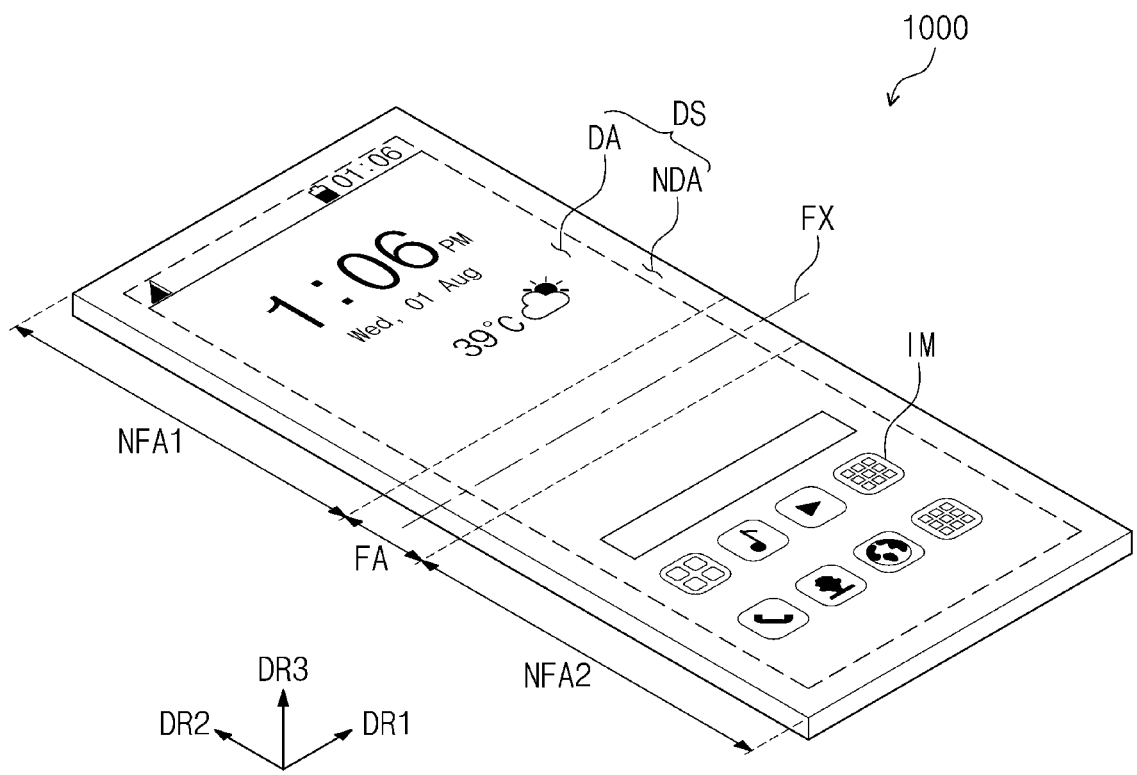
FIG. 1A is a perspective view of a display device according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concepts will be described with reference to the accompanying drawings.

Figure 1B:
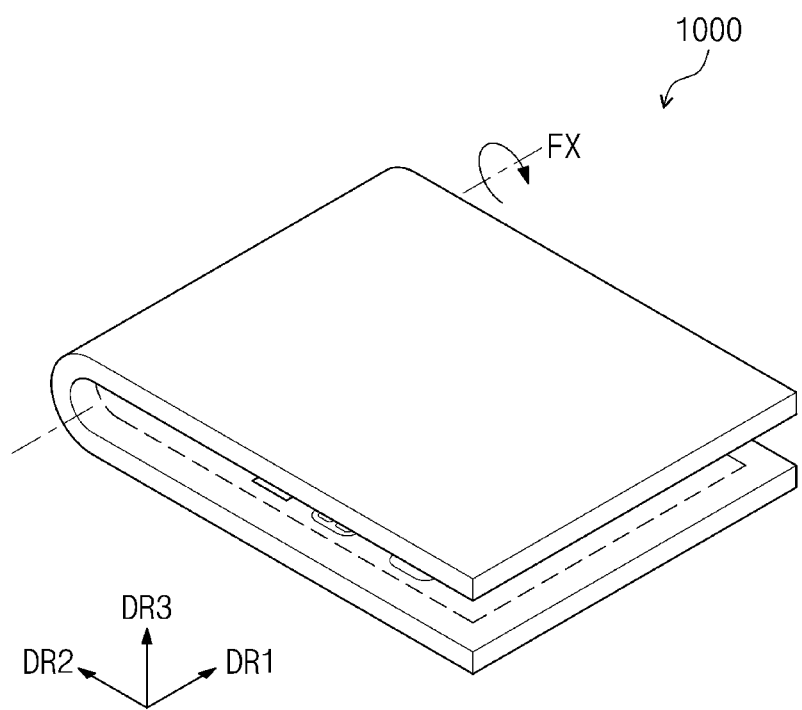
FIG. 1B is a perspective view of a display device according to an embodiment of the inventive concepts.

FIG. 1A is a perspective view of a display device according to an embodiment of the inventive concepts. FIG. 1B is a perspective view of a display device according to an embodiment of the inventive concepts.

Referring to FIG. 1A and FIG. 1B, a display device 1000 may be a foldable display device. The display device 1000 according to the embodiment of the inventive concepts may be used in small-to-medium scale electronic apparatuses such as mobile phones, tablets, vehicular navigation devices, game consoles, and smart watches.

A top surface of the display device 1000 may be defined as a display surface DS, and the display surface DS in an unfolded state may have a plane defined by a first direction DR1 and a second direction DR2.

The display surface DS may include a display area DA and a non-display area NDA adjacent to the display area DA. The display area DA is an area on which an image IM is displayed, and the non-display area NDA is an area on which the image IM is not displayed. In FIG. 1A, application icons are illustrated as one example of the image IM.

The non-display area NDA may surround the display area DA. However, the embodiment of the inventive concepts are not limited thereto, and the shapes of the display area DA and the non-display area NDA may be relatively designed. Alternatively, the non-display area NDA may be omitted.

In the display device 1000, a first non-folding area NFA1, a folding area FA, and a second non-folding area NFA2 may be defined in the second direction DR2 in this order. That is, the folding area FA may be defined between the first non-folding area NFA1 and the second non-folding area NFA2.

The one folding area FA and the first and second non-folding areas NFA1 and NFA2 are illustrated in FIG. 1A and FIG. 1B, but the number of the folding area FA and the first and second non-folding areas NFA1 and NFA2 are not limited thereto. The display device 1000 may include more than two, for example, a plurality of non-folding areas and folding areas disposed between the non-folding areas.

The display device 1000 may be folded with respect to a folding axis FX. That is, the folding area FA may be bent with respect to the folding axis FX. The folding axis FX may extend in the first direction DR1. The folding axis FX may be defined as a short axis parallel to the short sides of the display device 1000.

Thus, when the display device 1000 is folded, a display surface of the first non-folding area NFA1 and a display surface of the second non-folding area NFA2 may face each other. Thus, the display surface DS may not be exposed to the outside in a folded state. However, this is merely an example, and the embodiment of the inventive concepts are not limited thereto.

In an embodiment of the inventive concepts, when a display device 1000 is folded, a display surface of a first non-folding area NFA1 and a display surface of a second non-folding area NFA2 may be opposite to each other. Thus, the display surface DS may be exposed to the outside in a folded state.

FIG. 2 is a cross-sectional view of a display device according to an embodiment of the inventive concepts.

Referring to FIG. 2, a display device 1000 may include a window 100, an upper functional layer 200, a display module 300, a lower functional layer 400, a cushion layer 500, and a plurality of adhesive layers 101, 102, 103, and 104.

The window 100 protects the display module 300 against an external impact, and may provide a user with an input surface. The window 100 may include a glass substrate or a plastic film. The window 100 may include various configurations as long as having transparent characteristics. The window 100 may have a single-layered structure or multi-layered structure. The multi-layered structure may be formed through a continuous process or a bonding process using an adhesive layer.

The upper functional layer 200 may reduce the reflectivity of external light incident from the outside. For example, the upper functional layer 200 may include a polarization layer and a phase delay layer.

The display module 300 may include a display panel for generating an image and an input sensing layer for acquiring coordinate information about an external input.

The display panel may be a light emitting-type display panel, but is not particularly limited thereto. For example, the display panel may be an organic light emitting display panel or a quantum-dot light emitting display panel. A light emitting layer of the organic light emitting display panel may include an organic light emitting material. A light emitting layer of the quantum-dot light emitting display panel may include quantum dot, quantum rods, or the like.

The input sensing layer may be disposed directly on the display panel. For example, the input sensing layer may be formed directly on the display panel through a continuous process, but is not particularly limited thereto. The input sensing layer may be coupled to the display panel through the adhesive layer.

The input sensing layer may include a plurality of insulating layers and a plurality of conductive layers. The plurality of conductive layers may constitute a sensing electrode for sensing an input from the outside, a sensing wire connected to the sensing electrode, and a sensing pad connected to the sensing wire. The input sensing layer may sense the external input by using a mutual capacitance method and/or a self capacitance method. However, the method for sensing the external input is not limited to the above-described examples.

The lower functional layer 400 may be a layer for protecting a bottom surface of the display module 300. The lower functional layer 400 may be disposed below the display module 300. The lower functional layer 400 may include a synthetic resin film, which may be a polyimide film or a polyethylene terephthalate film. However, this is merely an example, and the lower functional layer 400 is not limited the above-described example.

The cushion layer 500 may be disposed below the lower functional layer 400. The cushion layer 500 may be a layer for protecting the bottom surface of the display module 300 in conjunction with the lower functional layer 400. The cushion layer 500 may include sponge, foam, a urethane resin, or the like.

Each of the adhesive layers 101, 102, 103, and 104 may include a general adhesive or bonding agent. For example, each of the adhesive layers may be a pressure sensitive adhesive (PSA), an optical clear adhesive (OCA), and an optical clear resin (OCR).

The adhesive layer 101 is attached to the window 100 and the upper functional layer 200, the adhesive layer 102 is attached to the upper functional layer 200 and the display module 300, the adhesive layer 103 is attached to the display module 300 and the lower functional layer 400, and the adhesive layer 104 is attached to the lower functional layer 400 and the cushion layer 500. In an embodiment of the inventive concepts, at least a portion of the plurality of adhesive layers 101, 102, 103, and 104 may be omitted, or other adhesive layers may be added.

Figure 3:
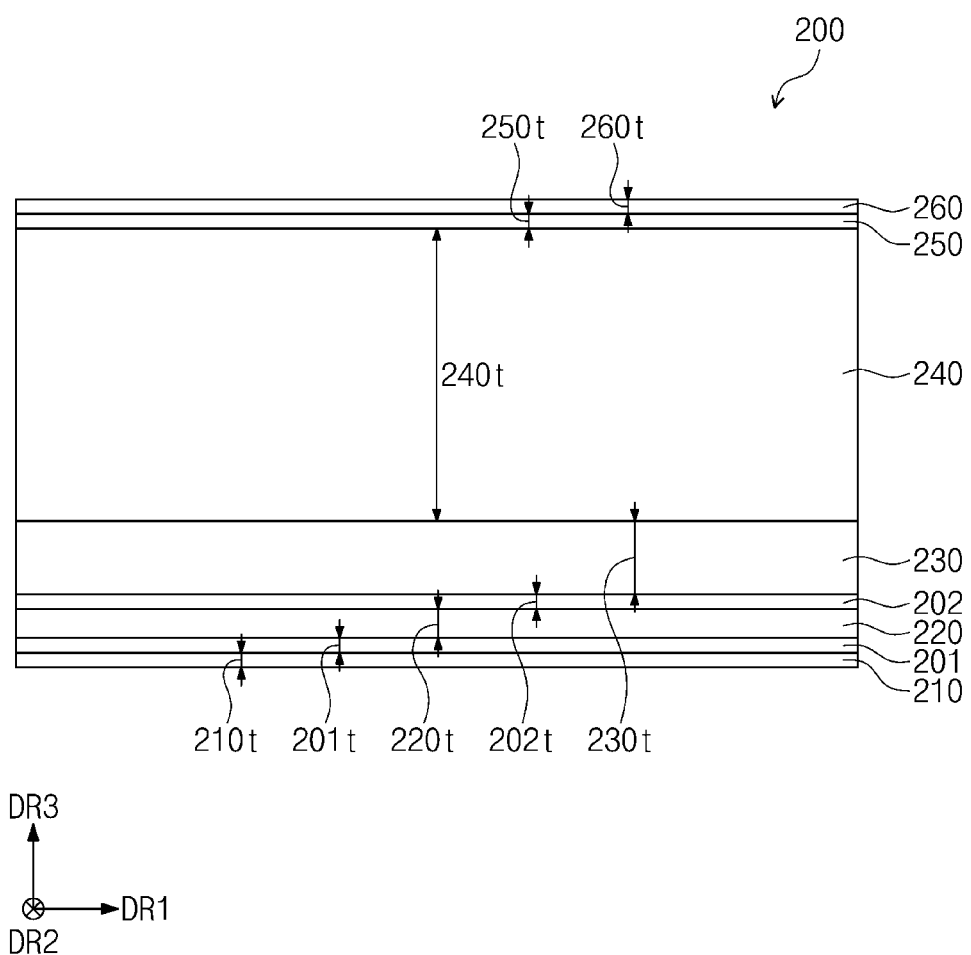
FIG. 3 is a cross-sectional view of an upper functional layer according to an embodiment of the inventive concepts.

FIG. 3 is a cross-sectional view of an upper functional layer according to an embodiment of the inventive concepts.

Referring to FIG. 2 and FIG. 3, the upper functional layer 200 may include a first phase delay layer 210, a second phase delay layer 220, a polarization layer 230, a protective layer 240, an alignment layer 250, and a third phase delay layer 260.

The first phase delay layer 210 may be disposed on the display module 300, and the first phase delay layer 210 may be a liquid crystal layer. The first phase delay layer 210 may be formed by applying liquid crystals. The first phase delay layer 210 may be a $\lambda/4$ phase delay layer. The first phase delay layer 210 may be an optical layer that delays, by $\lambda/4$, a phase of light provided to the first phase delay layer 210.

Also, the first phase delay layer 210 has optically anisotropic properties, and may change a polarization state of light incident onto the first phase delay layer 210. For example, light, provided to the first phase delay layer 210, in a linearly polarized state may be changed into light having a circularly polarized state, or light, provided to the first phase delay layer 210, in a circularly polarized state may be changed into light having a linearly polarized state.

The second phase delay layer 220 may be disposed on the first phase delay layer 210, and the second phase delay layer 220 may be a liquid crystal layer. The second phase delay layer 220 may be a $\lambda/2$ phase delay layer. The second phase delay layer 220 may be an optical layer that delays, by $\lambda/2$, a phase of light provided thereto.

The polarization layer 230 may be disposed on the second phase delay layer 220. The light delayed by the second phase delay layer 220 is provided to the polarization layer 230. The polarization layer 230 may linearly polarize the provided light in one direction.

The polarization layer 230 may be a film-type polarizer including a stretched polymer film. For example, the stretched polymer film may be a stretched polyvinyl alcohol-based film. The polarization layer 230 may be manufactured by adsorbing a dichroic dye onto the stretched polymer film. For example, the polarization layer 230 may be manufactured by stretching a polymer film about 5 to 6 times in a predetermined direction and immersing the stretched polymer film in a potassium iodide aqueous solution. Here, a direction in which the polymer film is stretched may be parallel to an absorbing axis of the polarization layer 230, and a direction perpendicular to the stretched direction may be parallel to a polarization axis of the polarization layer 230. The polarization axis may be referred to as a transmission axis.

The protective layer 240 may be disposed on the polarization layer 230. The protective layer 240 may protect the polarization layer 230 against moisture. The protective layer 240 may be acrylic, triacetyl cellulose (TAC), or polymethylmethacrylate (PMMA).

The alignment layer 250 may be disposed on the protective layer 240. The alignment layer 250 may be in contact with the protective layer 240. That is, the alignment layer 250 and the protective layer 240 may be in direct contact with each other, and an additional layer may not be disposed between the alignment layer 250 and the protective layer 240. That is, the alignment layer 250 is formed directly on the protective layer 240 without a base material, and thus a total thickness of the display device 1000 may be reduced. As a result, the display device 1000 may be more easily folded.

The alignment layer 250 may be formed through chemical imidation and thermal imidation in which dianhydride and diamine are used.

The alignment layer 250 may be physically aligned. For example, rubbing fabric is wound around a cylindrical roller made of metal, and then the rubbing fabric may come into contact with the alignment layer 250 while the cylindrical roll rotates. The alignment layer 250 rubbed with the rubbing fabric may be changed into a structure capable of arranging liquid crystal molecules in a specific direction.

The alignment layer 250 may be optically aligned. In an optical alignment method, a polymer material is irradiated with ultraviolet light, and the alignment layer 250 irradiated with the ultraviolet light may be changed into a structure capable of arranging liquid crystal molecules in a specific direction. For example, the alignment layer 250 may be changed into a structure capable of aligning liquid crystal molecules in a specific direction through a photoisomerization reaction, a photolysis reaction, a photopolymerization reaction, or a photocuring reaction.

The third phase delay layer 260 may be disposed on the alignment layer 250, and the third phase delay layer 260 may be a liquid crystal layer. The third phase delay layer 260 may include rod-shaped liquid crystal molecules or discotic liquid crystal molecules.

The third phase delay layer 260 may be a λ/4 phase delay layer. Light, provided to the third phase delay layer 260, in a linearly polarized state may be changed into light having a circularly polarized state. The phenomenon in which an image is not visible when wearing polarizing sunglasses or the like may be eliminated by the third phase delay layer 260.

When a wavelength of light that passes through the polarization layer 230 and is provided to the third phase delay layer 260 is about 550±50 nm, the light passing through the third phase delay layer 260 may have a phase delay value of about 137.5±12.5 nm, for example, may have a phase delay value of about 137.5 nm.

When the third phase delay layer 260 is a positive-A-plate, the refractive index of the third phase delay layer 260 in the direction of a slow axis may be about 1.6±0.3, and the refractive index in the direction of a fast axis may be about 1.4625±0.3. For example, the refractive index in the direction of the slow axis may be about 1.615, and the refractive index in the direction of the fast axis may be about 1.4775.

When the third phase delay layer 260 is a negative-A-plate, the refractive index of the third phase delay layer 260 in the direction of a slow axis may be about 1.4625±0.3, and the refractive index in the direction of a fast axis may be about 1.6±0.3.

Each of the adhesive layers 201 and 202 may include a general adhesive or bonding agent. For example, each of the adhesive layers may be a pressure sensitive adhesive (PSA), an optical clear adhesive (OCA), and an optical clear resin (OCR). The adhesive layer 201 may be attached to the first phase delay layer 210 and the second phase delay layer 220, and the adhesive layer 202 may be attached to the second phase delay layer 220 and the polarization layer 230.

Each of the thickness $210t$ of the first phase delay layer 210, the thicknesses $201t$ and $202t$ of a plurality of adhesive layers 201 and 202, the thickness $250t$ of the alignment layer 250, the thickness $260t$ of the third phase delay layer 260 may be less than the thickness $220t$ of the second phase delay layer 220. In the present specification, the thickness means a thickness in a direction parallel to a third direction DR3 crossing both the first direction DR1 and the second direction DR2.

The thickness $220t$ of the second phase delay layer 220 may be about 2 μm, and each of the thickness $210t$ of the first phase delay layer 210, the thicknesses $201t$ and $202t$ of the plurality of adhesive layers 201 and 202, the thickness $250t$ of the alignment layer 250, and the thickness $260t$ of the third phase delay layer 260 may be about 1 μm. The thickness $230t$ of the polarization layer 230 may be about 5 μm, and the thickness $240t$ of the protective layer 240 may be about 20 μm to about 25 μm.

The total thickness of the upper functional layer 200 may be about 40 μm or less. For example, the total thickness of the first phase delay layer 210, the second phase delay layer 220, the polarization layer 230, the third phase delay layer 260, the alignment layer 250, and the protective layer 240 may be about 30 μm to about 35 μm.

The thickness of each of the layers is not limited to the values mentioned above. For example, in the case of the adhesive layers 201 and 202, the thicknesses $201t$ and $202t$ of the adhesive layers 201 and 202 may be determined by considering the adhesive strength and possibility of delamination when folded. Also, the thicknesses $210t$, $220t$, $260t$, and $230t$ of the phase delay layers 210, 220, and 260 and the polarization layer 230 may be determined by considering the achievement of optical characteristics and the reduction in thickness.

Figure 4:
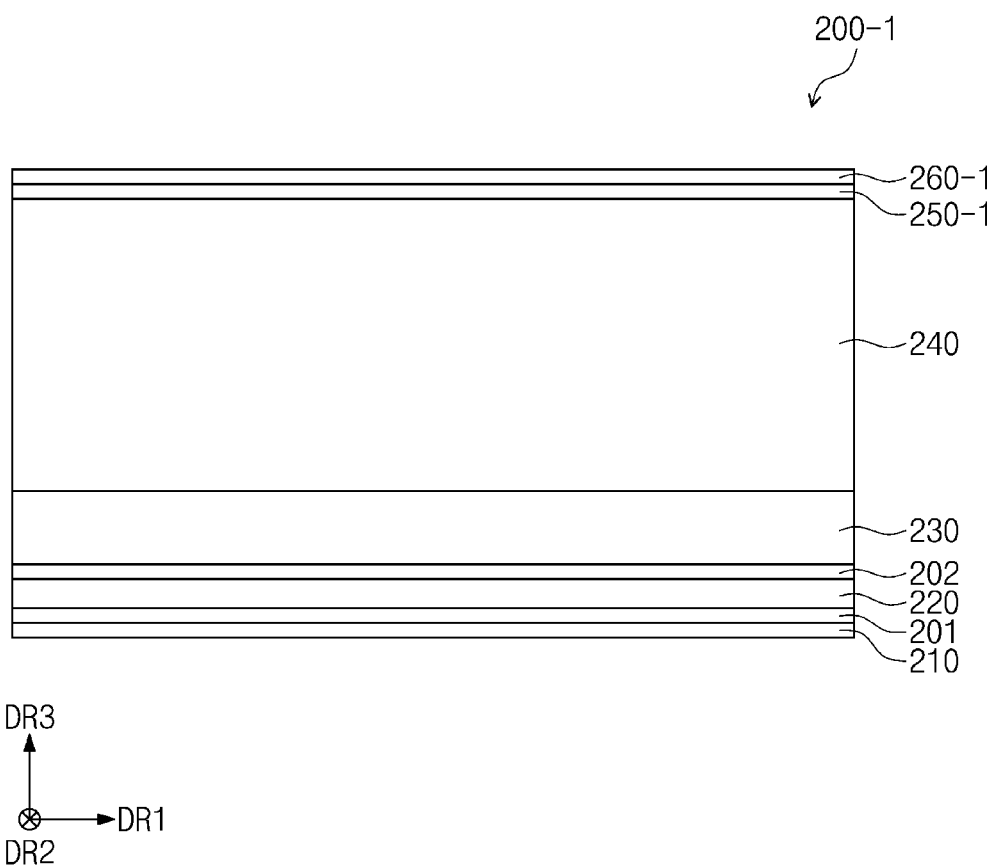
FIG. 4 is a cross-sectional view of an upper functional layer according to an embodiment of the inventive concepts.

FIG. 4 is a cross-sectional view of an upper functional layer according to an embodiment of the inventive concepts.

Referring to FIG. 4, an upper functional layer 200-1 may include a first phase delay layer 210, a second phase delay layer 220, a polarization layer 230, a protective layer 240, an adhesive layer 250-1, and a third phase delay layer 260-1.

When compared to FIG. 3, the adhesive layer 250-1 instead of the alignment layer 250 (see FIG. 3) may be disposed between the third phase delay layer 260-1 and the protective layer 240. The adhesive layer 250-1 may be in direct contact with the third phase delay layer 260-1 and the protective layer 240.

The third phase delay layer 260-1 is coupled directly to the adhesive layer 250-1 without a base material, and thus the total thickness of the display device 1000 (see FIG. 1A) may be reduced. As a result, the display device 1000 (see FIG. 1A) may be more easily folded.

Figure 5:
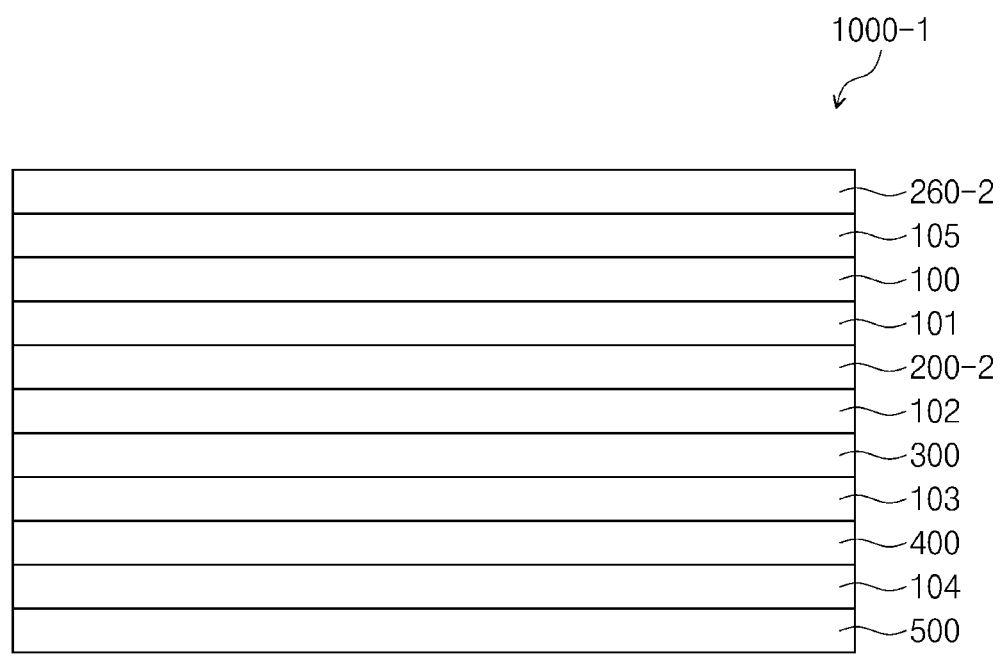
FIG. 5 is a cross-sectional view of a display device according to an embodiment of the inventive concepts.

FIG. 5 is a cross-sectional view of a display device according to an embodiment of the inventive concepts. FIG. 6 is a cross-sectional view of an upper functional layer according to an embodiment of the inventive concepts.

Referring to FIG. 5 and FIG. 6, a display device 1000-1 may include a window 100, an upper functional layer 200-2, a display module 300, a lower functional layer 400, a cushion layer 500, a phase delay layer 260-2, and a plurality of adhesive layers 101, 102, 103, 104, and 105.

The upper functional layer 200-2 may include a first phase delay layer 210, a second phase delay layer 220, a polarization layer 230, and a protective layer 240. That is, when compared to FIG. 3 and FIG. 4 described above, the upper functional layer 200-2 may not include the third phase delay layer 260 or 260-1 (see FIG. 3 or FIG. 4).

The phase delay layer 260-2 may be attached to the window 100 through the adhesive layer 105. The phase delay layer 260-2 may be a λ/4 phase delay layer. Light, provided to the phase delay layer 260-2, in a linearly polarized state may be changed into light in a circularly polarized state. The phenomenon in which an image is not visible when wearing polarizing sunglasses or the like may be eliminated by the phase delay layer 260-2.

The phase delay layer 260-2 may be a film-type phase delay layer including a stretched polymer film. The stretched polymer film may be triacetyl cellulose (TAC), cyclo-olefin polymer (COP), polyethylene terephthalate (PET), or polymethylmethacrylate (PMMA).

Figure 7:
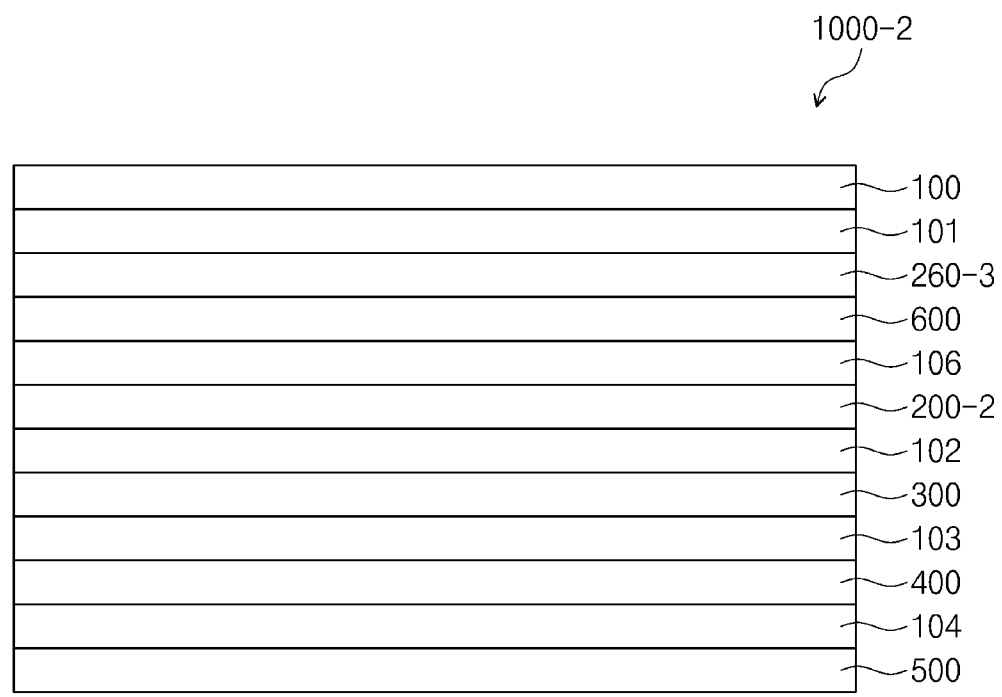
FIG. 7 is a cross-sectional view of a display device according to an embodiment of the inventive concepts.

FIG. 7 is a cross-sectional view of a display device according to an embodiment of the inventive concepts.

Referring to FIG. 7, a display device 1000-2 may include a window 100, an upper functional layer 200-2, a display module 300, a lower functional layer 400, a cushion layer 500, a buffer layer 600, a phase delay layer 260-3, and a plurality of adhesive layers 101, 102, 103, 104, and 106.

The buffer layer 600 is a layer for improving the impact resistance and may be attached to the upper functional layer 200-2 through the adhesive layer 106. The phase delay layer 260-3 may be applied on the buffer layer 600. The phase delay layer 260-3 may be a λ/4 phase delay layer. Light, provided to the phase delay layer 260-3, in a linearly polarized state may be changed into light in a circularly polarized state. The phenomenon in which an image is not visible when wearing polarizing sunglasses or the like may be eliminated by the phase delay layer 260-3.

Figure 8:
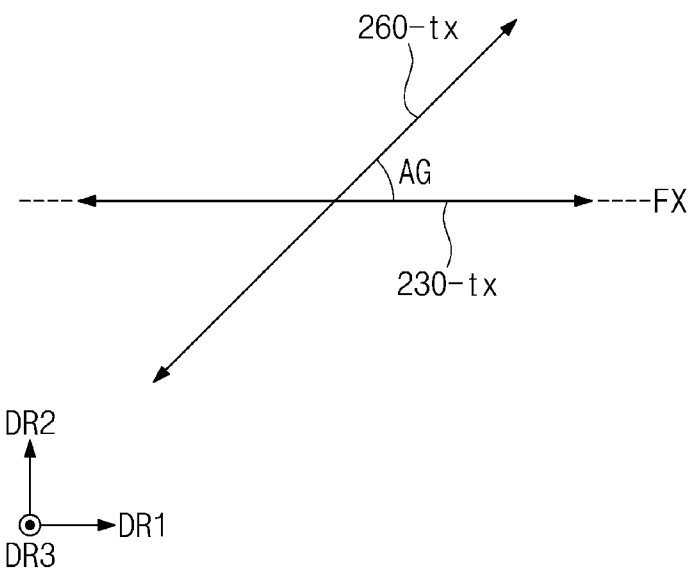
FIG. 8 is a view illustrating a relationship between a folding axis, a polarization axis of a polarization layer, and a slow axis of a phase delay layer in a display device according to an embodiment of the inventive concepts.

FIG. 8 is a view illustrating a relationship between a folding axis, a polarization axis of a polarization layer, and a slow axis of a phase delay layer in a display device according to an embodiment of the inventive concepts.

Referring to FIG. 3 and FIG. 8, a folding axis FX may extend in a first direction DR1.

An extension direction of a main chain of a polarization layer 230 may be parallel to an absorbing axis of the polarization layer 230, and an extension direction of a cross-linking chain of the polarization layer 230 may be parallel to a polarization axis 230-tx of the polarization layer 230. The polarization axis 230-tx of the polarization layer 230 may be parallel to the folding axis FX. That is, the polarization axis 230-tx may extend in the first direction DR1. In this case, the extension direction of the main chain of the polarization layer 230, having a relatively stronger durability against the folding, intersects with the folding axis FX, and the possibility that the molecular bonding in a direction parallel to the polarization axis 230-tx is broken may be reduced.

An angle AG between a slow axis 260-tx of the third phase delay layer 260 and the polarization axis 230-tx of the polarization layer 230 may be about 45°±30°. For example, the angle AG may be about 45°.

Figure 9:
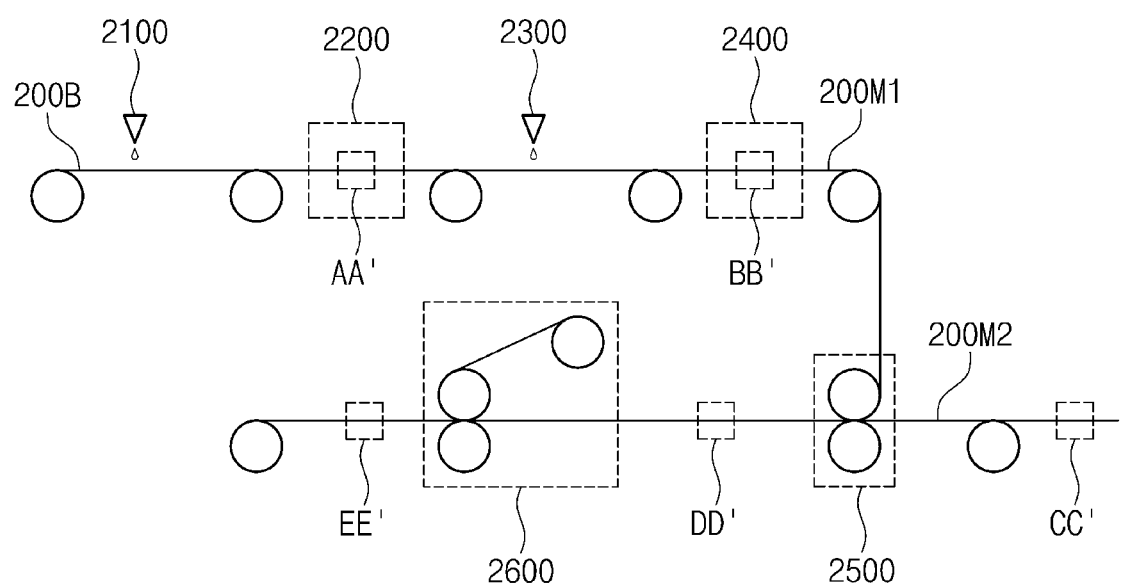
FIG. 9 is a view illustrating a portion of processes in a method for manufacturing a display device according to an embodiment of the inventive concepts.

FIG. 9 is a view illustrating a portion of processes in a method for manufacturing a display device according to an embodiment of the inventive concepts. FIG. 10A to FIG. 10E are enlarged views of portions of FIG. 9.

FIG. 9 illustrates a method for manufacturing the upper functional layer 200-1 of FIG. 4.

Referring to FIG. 4 and FIG. 9, the method for manufacturing the upper functional layer 200-1 may include a process of providing the polarization layer 230, a process of providing the protective layer 240 on one surface of the polarization layer 230, and a process of providing the phase delay layer 260-1 on one surface of the protective layer 240. In this case, the angle AG (see FIG. 8) between the polarization axis 230-tx (see FIG. 8) of the polarization layer 230 and the slow axis 260-tx (see FIG. 8) of the phase delay layer 260-1 may be about 45°±30°. Hereinafter, each of the processes will be described in detail.

A film 200B is provided. The film 200B may be a flexible film. A polymer material is applied (2100) on the film 200B.

Figure 10A:
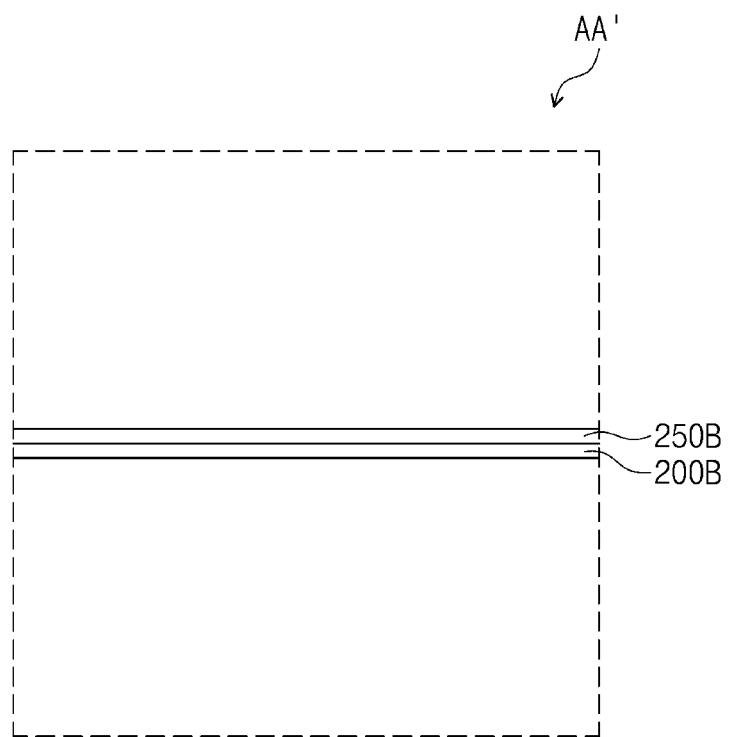
FIG. 10A, FIG. 10B, FIG. 10C, FIG. 10D and FIG. 10E are enlarged views of portions of FIG. 9.

Referring to FIG. 9 and FIG. 10A, an alignment layer 250B may be formed on the film 200B through an alignment process (2200). The alignment process (2200) includes a drying or rubbing process, or may include a process for emitting polarized ultraviolet light.

Figure 10B:
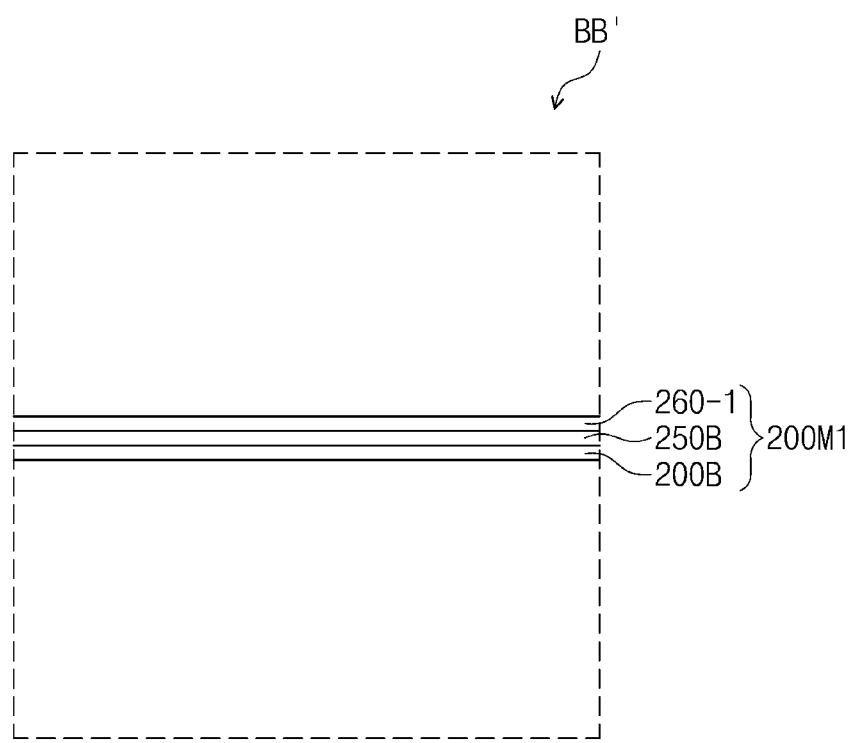

Referring to FIG. 9 and FIG. 10B, a liquid crystal material may be applied (2300) on the alignment layer 250B to form a liquid crystal layer 260-1. The ultraviolet light may be emitted (2400) on the liquid crystal layer 260-1. The liquid crystal layer 260-1 may be referred to as the phase delay layer 260-1.

A structure in which the film 200B, the alignment layer 250B, and the phase delay layer 260-1 are stacked in this order is referred to as a first intermediate film 200M1.

Figure 10C:
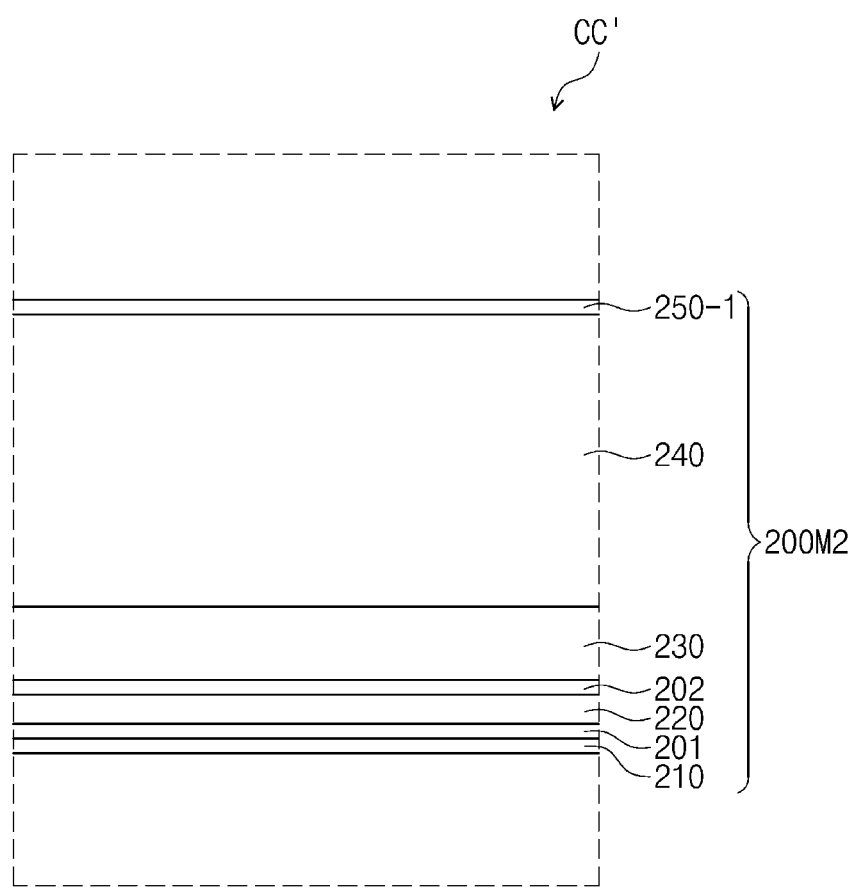

Referring to FIG. 9 an FIG. 10C, a second intermediate film 200M2 is provided in which the first phase delay layer 210, the adhesive layer 201, the second phase delay layer 220, the adhesive layer 202, the polarization layer 230, the protective layer 240, and the adhesive layer 250-1 are stacked in this order.

Referring to FIG. 9, the first intermediate film 200M1 and the second intermediate film 200M2 may be laminated (2500) to each other.

Figure 10D:
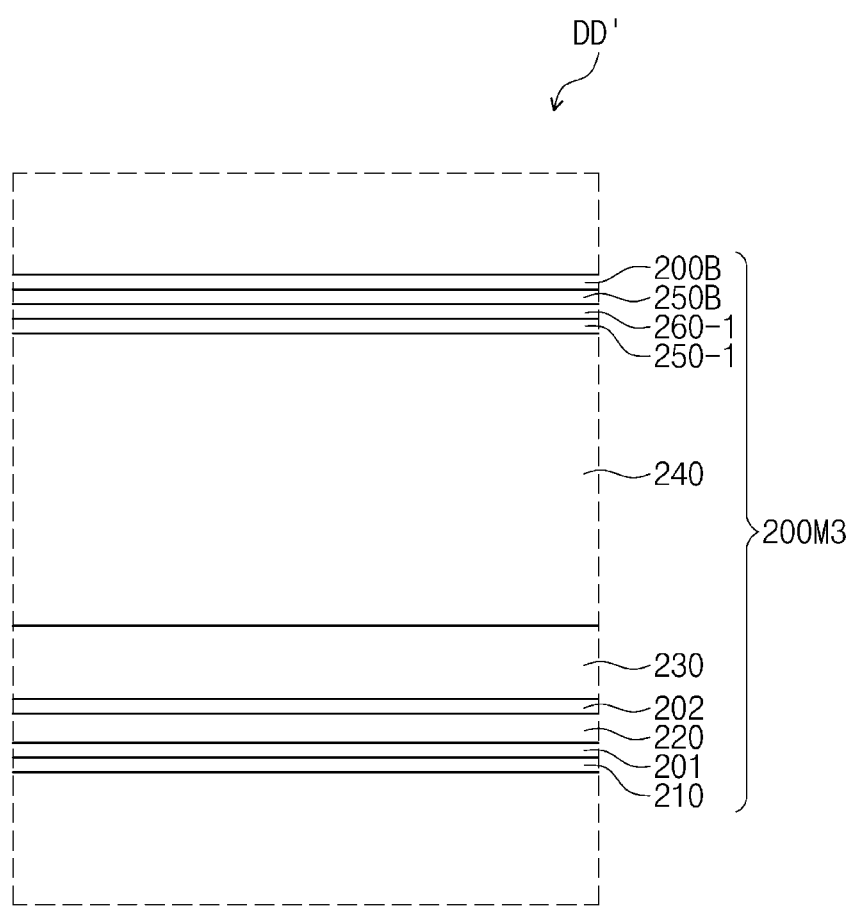

Referring to FIG. 10D, the phase delay layer 260-1 of the first intermediate film 200M1 may be attached to the adhesive layer 250-1 of the second intermediate film 200M2. That is, the first intermediate film 200M1 and the second intermediate film 200M2 are attached to each other, and thus a third intermediate film 200M3 may be formed.

Figure 10E:
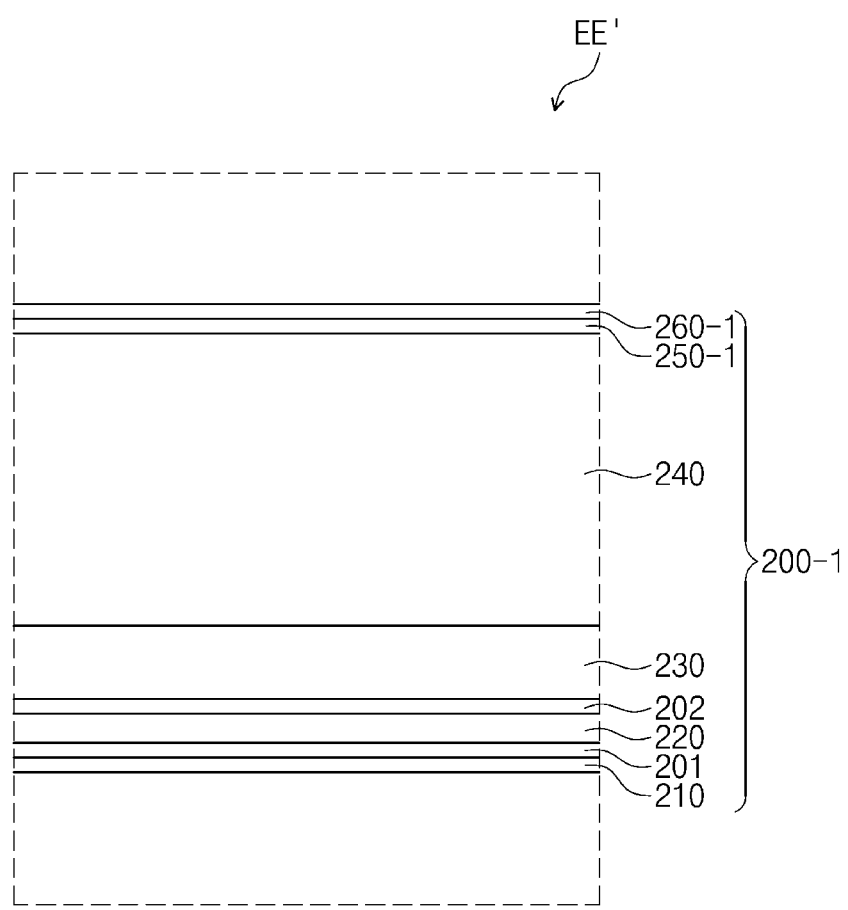

Referring to FIG. 9 and FIG. 10E, the alignment layer 250B and the film 200B are removed (2600) from the third intermediate film 200M3, and thus the upper functional layer 200-1 may be formed.

Figure 11:
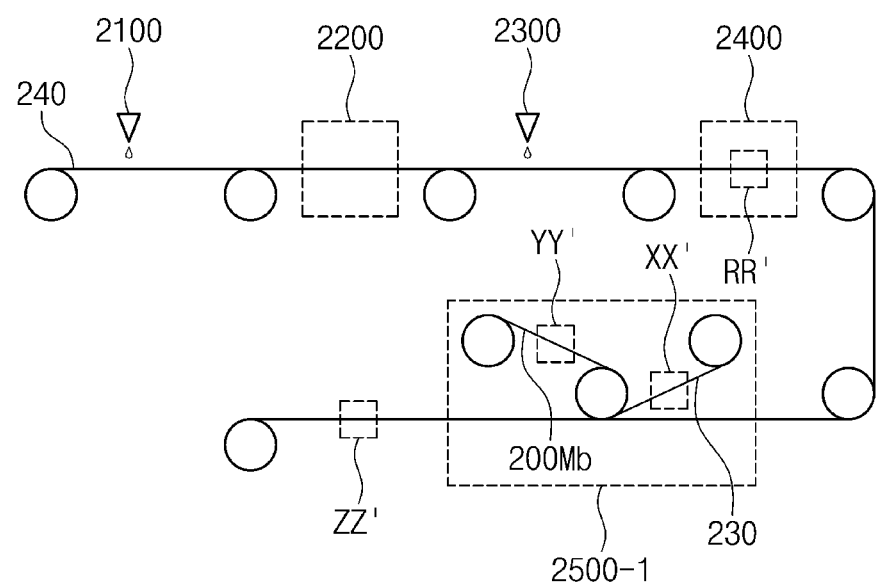
FIG. 11 is a view illustrating a portion of processes in a method for manufacturing a display device according to an embodiment of the inventive concepts.

FIG. 11 is a view illustrating a portion of processes in a method for manufacturing a display device according to an embodiment of the inventive concepts. FIG. 12A to FIG. 12D are enlarged views of portions of FIG. 11.

FIG. 11 illustrates a method for manufacturing the upper functional layer 200 of FIG. 3.

Referring to FIG. 3 and FIG. 11, the method for manufacturing the upper functional layer 200 may include a process of providing the polarization layer 230, a process of providing the protective layer 240 on one surface of the polarization layer 230, and a process of providing the phase delay layer 260 on one surface of the protective layer 240. In this case, the angle AG (see FIG. 8) between the polarization axis 230-tx (see FIG. 8) of the polarization layer 230 and the slow axis 260-tx (see FIG. 8) of the phase delay layer 260 may be about 45°±30°. Hereinafter, each of the processes will be described in detail.

Figure 12A:
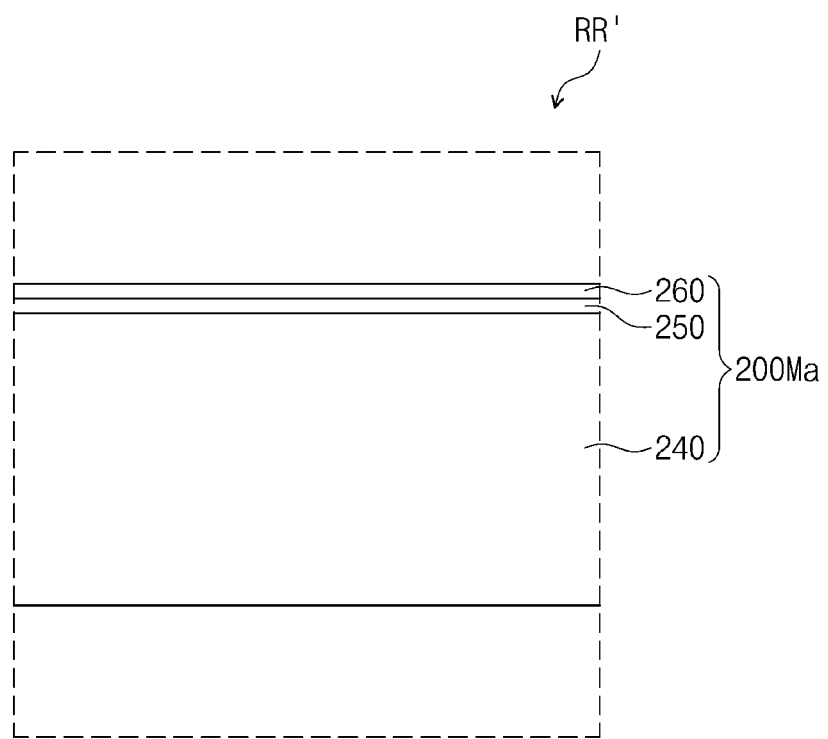
FIG. 12A, FIG. 12B, FIG. 12C, and FIG. 12D are enlarged views of portions of FIG. 11.

Referring to FIG. 11 and FIG. 12A, the protective layer 240 is provided. The alignment layer 250 is applied (2100) to the protective layer 240. Subsequently, an alignment process (2200) may be performed. The alignment process (2200) includes a drying or rubbing process, or may include a process for emitting polarized ultraviolet light. A liquid crystal material may be applied (2300) on the alignment layer 250 to form a liquid crystal layer 260. The ultraviolet light may be emitted (2400) on the liquid crystal layer 260. The liquid crystal layer 260 may be referred to as the phase delay layer 260.

A structure in which the protective layer 240, the alignment layer 250, and the phase delay layer 260 are stacked in this order is referred to as a first intermediate film 200Ma.

Figure 12B:
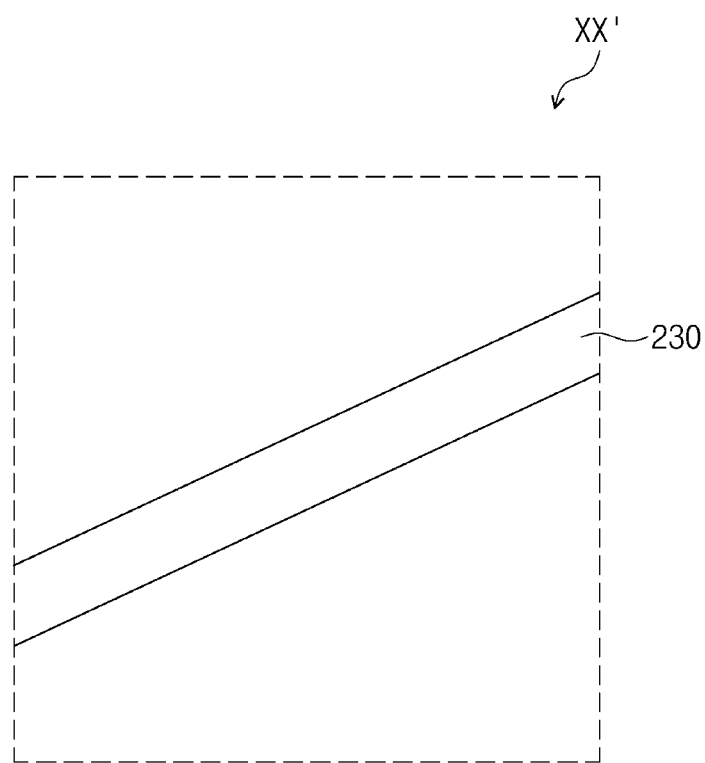

Referring to FIG. 11 and FIG. 12B, the polarization layer 230 may be provided on one surface of the first intermediate film 200Ma.

Figure 12C:
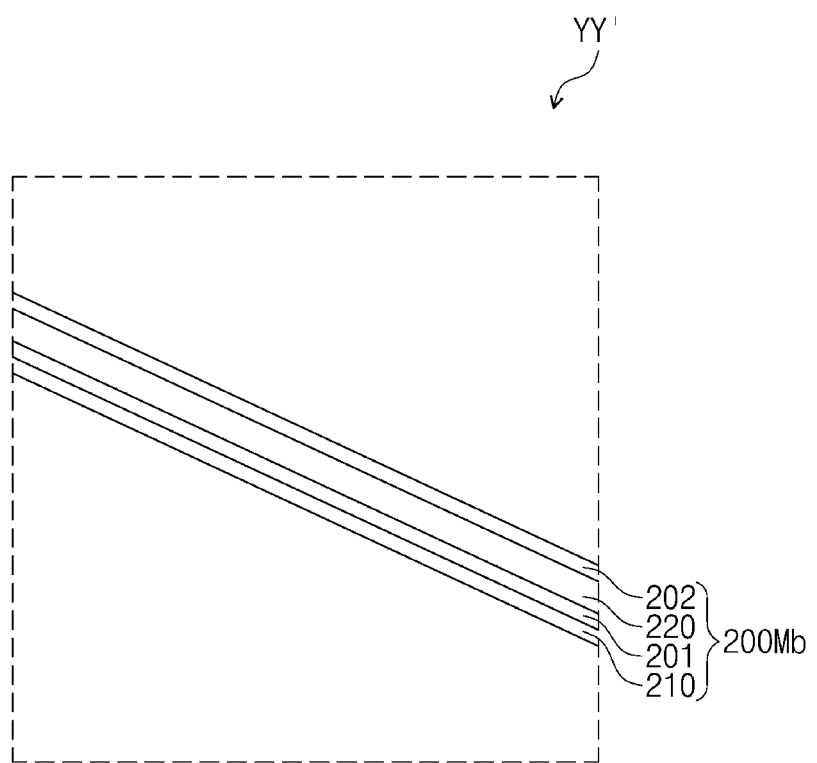

Also, referring to FIG. 11 an FIG. 12C, a second intermediate film 200Mb, in which the first phase delay layer 210, the adhesive layer 201, the second phase delay layer 220, and the adhesive layer 202 are stacked in this order, may be provided on one surface of the polarization layer 230.

Referring to FIG. 11, the first intermediate film 200Ma, the polarization layer 230, and the second intermediate film 200Mb may be laminated (2500-1) to each other.

Figure 12D:
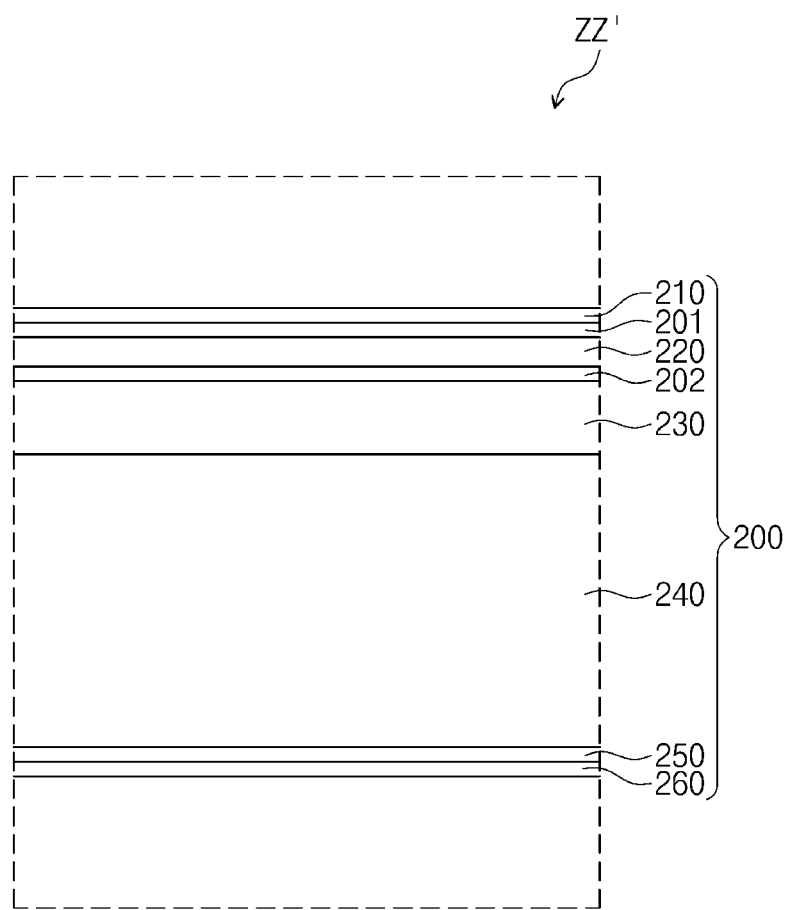

Referring to FIG. 12D, the adhesive layer 202 of the second intermediate film 200Mb is attached to the one surface of the polarization layer 230, and the other surface of the polarization layer 230 may be coupled to the protective layer 240. That is, the first intermediate film 200Ma, the polarization layer 230, and the second intermediate film 200Mb are attached to each other, and thus the upper functional layer 200 may be formed.

According to the embodiment of the inventive concepts, the extension direction of the main chain of the polarization layer, having a relatively stronger durability against the folding, may intersect with the folding axis of the display device. The extension direction of the main chain may be perpendicular to the polarization axis of the polarization layer. That is, the folding axis and the polarization axis may be parallel to each other, and the possibility that the molecular bonding in the direction parallel to the polarization axis is broken may be reduced.

Also, the light passing through the polarization layer may be changed, by the phase delay layer, from the linearly polarized state to the circularly polarized state. Thus, the phenomenon in which the image is not visible when wearing the polarizing sunglasses or the like may be eliminated by the phase delay layer.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display module having a folding axis and configured to be folded with respect to the folding axis extending in a first direction;
a polarization layer disposed on the display module and having a polarization axis parallel to the first direction;
a protective layer disposed on the polarization layer opposite the display module; and
a phase delay layer disposed on the protective layer opposite the polarization layer and configured to change linearly polarized light, which passes through the polarization layer, into circularly polarized light,
a $\lambda/2$ phase delay layer disposed between the display module and the polarization layer; and a $\lambda/4$ phase delay layer disposed between the $\lambda/2$ phase delay layer and the display module, wherein a thickness of the protective layer is greater than a sum of a thickness of the polarization layer, the $\lambda/2$ phase delay layer, the $\lambda/4$ phase delay layer, and the phase delay layer.

2. The display device of claim 1, wherein the phase delay layer is a liquid crystal layer.

3. The display device of claim 2, wherein the phase delay layer comprises rod-shaped liquid crystal molecules or discotic liquid crystal molecules.

4. The display device of claim 2, further comprising an alignment layer disposed between the polarization layer and the phase delay layer,
wherein the alignment layer is in contact with the phase delay layer.

5. The display device of claim 4,
wherein the alignment layer is in contact with the protective layer.

6. The display device of claim 1, wherein the phase delay layer is a stretched film layer.

7. The display device of claim 1, wherein a slow axis of the phase delay layer intersects with the polarization axis.

8. The display device of claim 7, wherein an angle between the slow axis and the polarization axis is about 45°±30°.

9. The display device of claim 1, wherein a thickness of the phase delay layer is about 1 μm.

10. A display device comprising:
a display module which is folded with respect to a folding axis extending in a first direction;
a first phase delay layer disposed on the display module;
a second phase delay layer disposed on the first phase delay layer;
a polarization layer disposed on the second phase delay layer and having a polarization axis parallel to the first direction;
a protective layer disposed on the polarization layer opposite the display module; and
a third phase delay layer disposed on the protective layer opposite the polarization layer and having a slow axis,
wherein an angle between the slow axis and the polarization axis is about 45°±30° and
wherein a thickness of the protective layer is greater than a sum of a thickness of the polarization layer, the first phase delay layer, the second phase delay layer, and the third phase delay layer.

11. The display device of claim 10, wherein each of the first phase delay layer and the third phase delay layer is a $\lambda/4$ phase delay layer, and the second phase delay layer is a $\lambda/2$ phase delay layer,
wherein a thickness of the second phase delay layer is greater than a thickness of the third phase delay layer.

12. The display device of claim 10, further comprising an alignment layer disposed between the polarization layer and the third phase delay layer,
wherein the alignment layer is in contact with the third phase delay layer.

13. The display device of claim 12,
wherein the alignment layer is in contact with the protective layer.

14. The display device of claim 13, wherein a total thickness of the first phase delay layer, the second phase delay layer, the polarization layer, the third phase delay layer, the alignment layer, and the protective layer is about 30 μm to about 35 μm.

* * * * *